US006853031B2

(12) United States Patent
Liao et al.

(10) Patent No.: US 6,853,031 B2

(45) Date of Patent: Feb. 8, 2005

(54) STRUCTURE OF A TRAPEZOID-TRIPLE-GATE FET

(75) Inventors: Wen-Shiang Liao, Miao-Li (TW); Jiunn-Ren Hwang, Hsin-Chu (TW); Wei-Tsun Shiau, Kaohsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/417,167

(22) Filed: Apr. 17, 2003

(65) Prior Publication Data

US 2004/0206990 A1 Oct. 21, 2004

(51) Int. Cl.[7] ......................... H01L 29/76; H01L 29/94; H01L 31/062; H01L 31/113; H01L 31/119

(52) U.S. Cl. ....................... 257/328; 257/288; 257/327; 257/329; 257/330; 257/331; 257/332; 257/333; 257/334

(58) Field of Search .......................... 257/288, 327–334

(56) References Cited

U.S. PATENT DOCUMENTS 3,761,785 A * 9/1973 Pruniaux .................... 257/283
4,063,271 A * 12/1977 Bean et al. ................. 257/272
4,316,207 A * 2/1982 Matsumoto ................. 257/302
4,568,958 A * 2/1986 Baliga ........................ 257/332
4,763,180 A * 8/1988 Hwang et al. .............. 257/302
5,334,548 A * 8/1994 Shen et al. ................. 438/246
5,681,775 A * 10/1997 Pogge ........................ 438/406
5,963,807 A * 10/1999 Ueno ......................... 438/268
5,986,304 A * 11/1999 Hshieh et al. .............. 257/330
6,034,393 A * 3/2000 Sakamoto et al. .......... 257/315
6,043,122 A * 3/2000 Liu et al. .................... 438/257
6,043,531 A * 3/2000 Stecher et al. .............. 257/328
6,114,207 A * 9/2000 Okabe et al. ............... 438/270
6,117,345 A * 9/2000 Liu et al. ...................... 216/19
6,252,272 B1 * 6/2001 Watanabe et al. ........... 257/315
2001/0041421 A1 * 11/2001 Park et al. .................. 438/424
2002/0109182 A1 * 8/2002 Lee et al. .................... 257/330
2003/0211695 A1 * 11/2003 Chang ........................ 438/276

OTHER PUBLICATIONS

Intel Researchers; Three—Dimensional 'Tri–Gate' Transistors an Alernative to Traditional Flat Planar Transistors; Sep. 19, 2002;www.intel.com/pressroom.

* cited by examiner

*Primary Examiner*—Amir Zarabian
*Assistant Examiner*—Ida M. Soward
(74) *Attorney, Agent, or Firm*—Nath & Associates PLLC; Harold L. Novick

(57) ABSTRACT

A structure of a Trapezoid-Triple-Gate Field Effect Transistor (FET) includes a plurality of trapezoid pillars being transversely formed on an crystalline substrate or Silicon-On-Insulator (SOI) wafer. The trapezoid pillars can juxtapose with both ends connected each other. Each trapezoid pillar has a source, a channel region, and a drain aligned in longitudinal direction and a gate latitudinally superposes the channel region of the trapezoid pillar. The triple gate field effect transistor comprises a dielectric layer formed between the channel region and the conductive gate structure.

13 Claims, 3 Drawing Sheets

2 4 12 11 10 6 18 19 14 8 16

STRUCTURE OF A TRAPEZOID-TRIPLE-GATE FET

BACKGROUND OF THE INVENTION

1. Field of the Invention

The present invention relates to a structure of a Trapezoid-Triple-Gate Field Effect Transistor (FET), and more particularly, fabricating a field effect transistor with a triple gate conductive structure formed on a plurality of the underlying FET device channel's trapezoid pillars for drastically increasing the channel conductance area (or width) and the device drive current of this Trapezoid-Triple-Gate FET due to its drastically increased channel conduction width.

2. Description of the Prior Art

Triple-Gate Field Effect Transistors (FET) with increasingly higher device channel conductance, process and device reliabilities, device density and lower production cost are being developed ceaseless. The gate vertical sidewall field effect transistor, as reported at the internet page: http://www.intel.com/pressroom/archive/releases/20020919tech.htm, has been demonstrated by the Intel® researchers.

Intel® researchers have developed a field effect transistor with a three-dimensional triple gate that achieves higher device operation performance with greater power efficiency than the traditional planar (flat) transistors. The Triple-Gate FET of Intel® employs a novel 3-D structure, like a raised, flat plateau with two parallel vertical device conduction sidewalls, which sends the electrical carriers along the top and both parallel vertical sidewalls of the transistor device. This will effectively triple the area available for the electrical carriers to travel, like turning a one-lane road into a three-lane highway, but without taking up more space. The Triple-Gate FET possess relatively higher device channel conductance area (or width) and relatively higher device drive current as well, which makes possible greater ultra-high device density and lower production cost in the future.

Even if Intel® Corp. proved the triple gate transistors that have the higher device channel conductance, more ultra-high device density and lower production cost than flat transistors, the transistors being developed by Intel® Corp. are easier to fall-down or strip-off while requesting relatively lower device size or higher device density. Hence, the disclosed present invention is designed to prevent the triple gate transistors from falling-down or stripping-off.

SUMMARY OF THE INVENTION

The structure of the field effect transistor with a triple gate is formed on trapezoid pillars. The triple gate field effect transistor includes plural trapezoid pillars horizontally formed on a crystalline substrate or Silicon-On-Insulator (SOI). Every trapezoid pillar parallels to each other and includes a gate structure. The two ends of trapezoid pillars include a source and a drain. The gate includes the electrical contacts and a middle part, which is formed under the gate, and includes a dielectric oxide layer formed between the gate and the silicon conductive region. The gate latitudinally superposes the channel region (the silicon conductive region) of the trapezoid pillars. The silicon conductive region is formed within the plurality of trapezoid pillars between the source and the drain.

The first object of the present invention is equipped with an underlying fastened trapezoid pillar structure for preventing the falling-down and stripping-off like that in the prior art.

The second object of the present invention is to provide a triple gate structure of the field effect transistor with a greatly increasing device channel conductance due to increased channel width of the triple gate formed on a plurality of trapezoid pillars.

The third object of the present invention is to provide a triple gate field effect transistor with increased ultra-high device density because of the increased device channel conductance for one device unit.

The fourth object of the present invention is to assure the process and the device reliabilities, and to decrease the production cost of the field effect transistor by forming a triple gate upon the trapezoid pillars.

All of these advantageous features as well as others are obvious from the following detailed description of preferred embodiments.

BRIEF DESCRIPTION OF THE DRAWINGS

The foregoing aspects and many attendant advantages of this invention will be better understood by reference to the following detailed description in the following drawings.

DETAILED DESCRIPTION OF THE PREFERRED EMBODIMENT

A preferred embodiment of the present invention that provides a trapezoid pillar of a triple gate for increasing device channel current will now be described in greater details. Nevertheless, it should be recognized that the present invention can be practiced in a wide range of other embodiments besides those explicitly described, and the scope of the present invention is expressly not limited except as specified in the accompanying claims.

Figure 1:
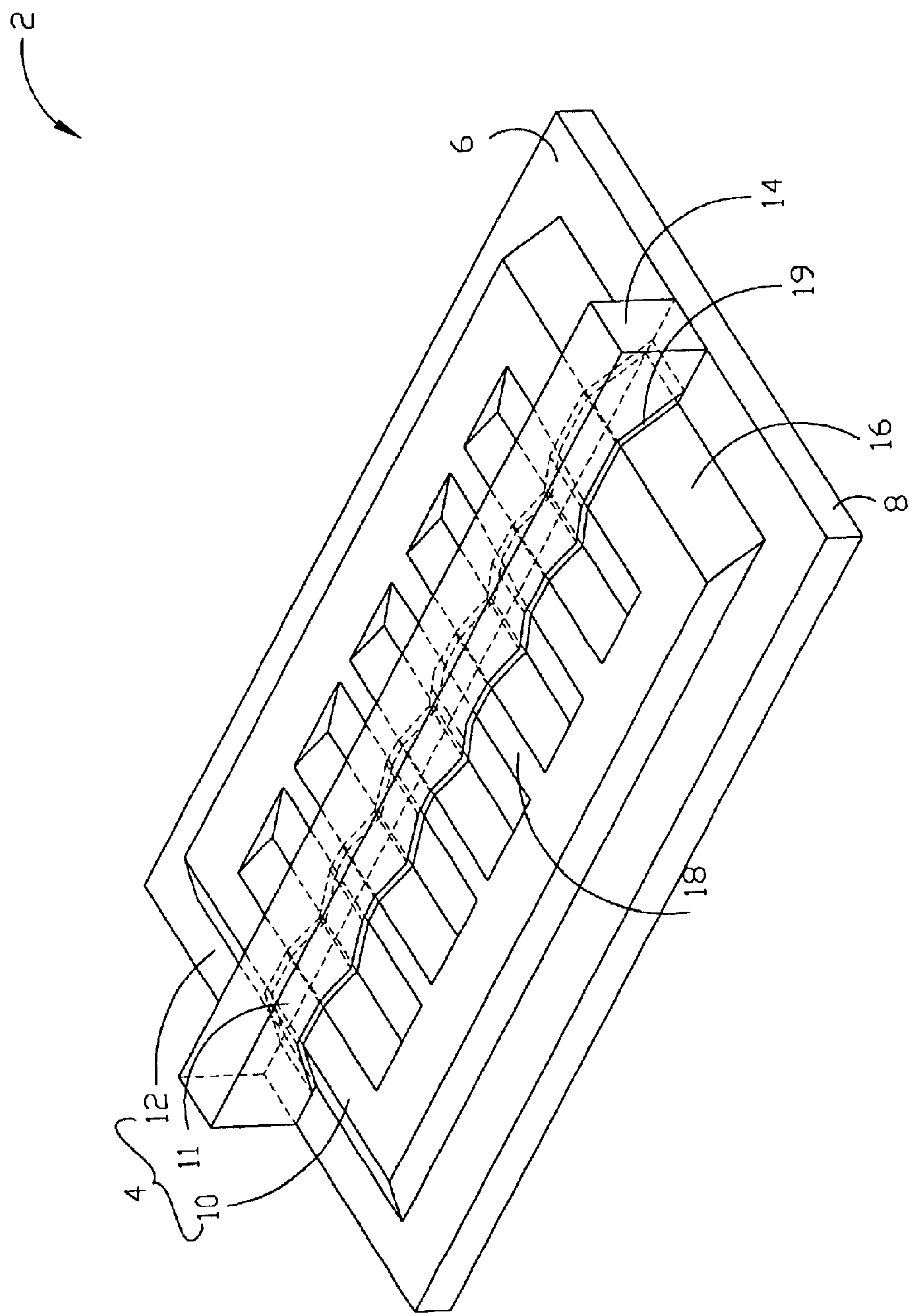
FIG. 1 is a three-dimensional perspective view of a triple gate FET in accordance with the present invention.

Referring now to FIG. 1, a FET 2 is shown. The FET 2 comprises a plurality of trapezoid pillars 4 of epitaxial silicon material formed on a surface 6 of a substrate 8. The trapezoid pillars 4 are parallel and connect in the ends to each other. Each trapezoid pillar 4 has a top surface and two inclined sidewalls. The trapezoid pillars 4 include a transistor structure. The two ends of each trapezoid pillar 4 include a source 10 and a drain 12. The transistor structure includes a middle part that includes a dielectric oxide layer 19 and a channel region 11 (a conductive region) that underlies a gate 14. The source 10 and the drain 12 are formed on the different end of the trapezoid pillars, and the channel region 11 which underlies the gate 14 is formed between the source 10 and the drain 12. The channel region 11 on a trapezoid pillar 4 includes a top surface and two side surfaces, and the gate 14 overlies the top surface and the side surfaces. In another word, the channel region 11 is formed on the top surface and the inclined sidewalls. Both the source 10 and the drain 12 are heavily doped by N-type dopants for NMOS and P-type dopants for PMOS whereas the channel region 11 is doped by P-type dopant for NMOS and N-types dopants for PMOS. A dielectric oxide layer 19 is formed between the gate 14 and the channel region 11.

The trapezoid pillars are formed on the epitaxially grown crystalline silicon layer in accordance with the (100) crystallographic plane. In view of the manner in which the trapezoid pillars 4 are formed, namely by etching, edges 16 of the trapezoid pillars 4 parallel to the (110) or the (111) crystallographic plane, whereas top surfaces 18 of the trapezoid pillars 4 parallel to the (100) crystallographic plane.

Figure 2:
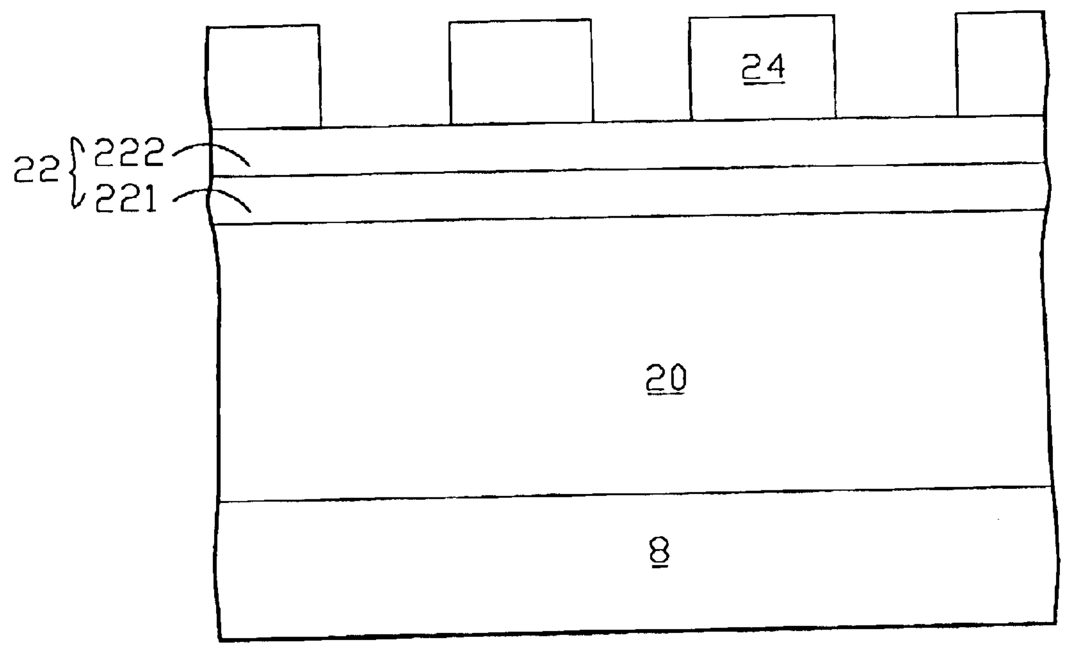
FIGS. 2–5 are cross sectional views illustrating the process for forming the structure in the present invention.
Figure 3:
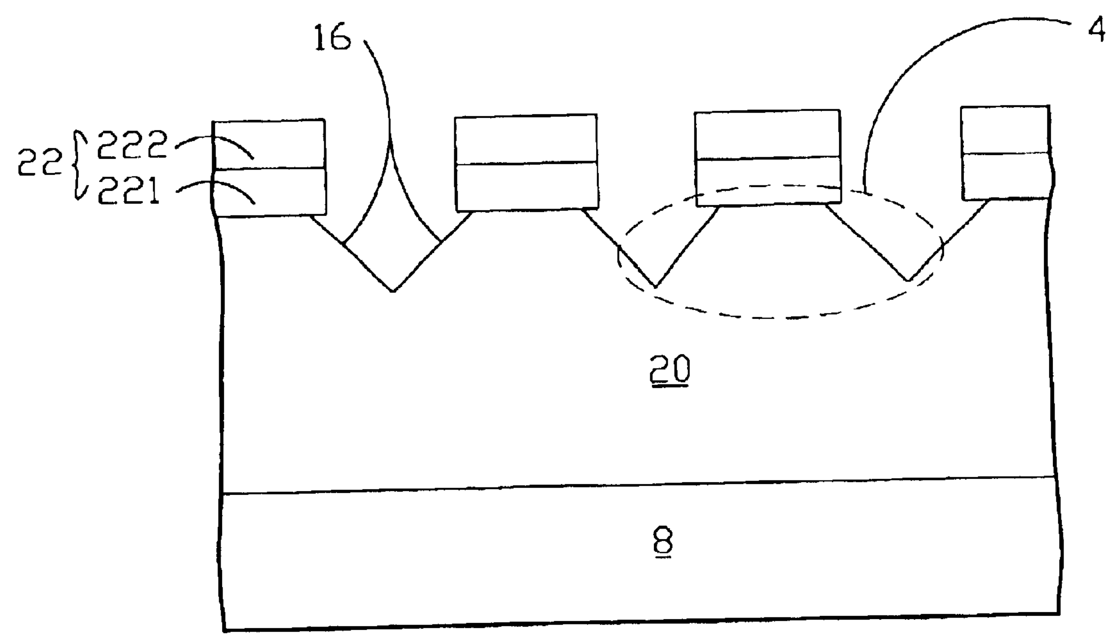
Figure 4:
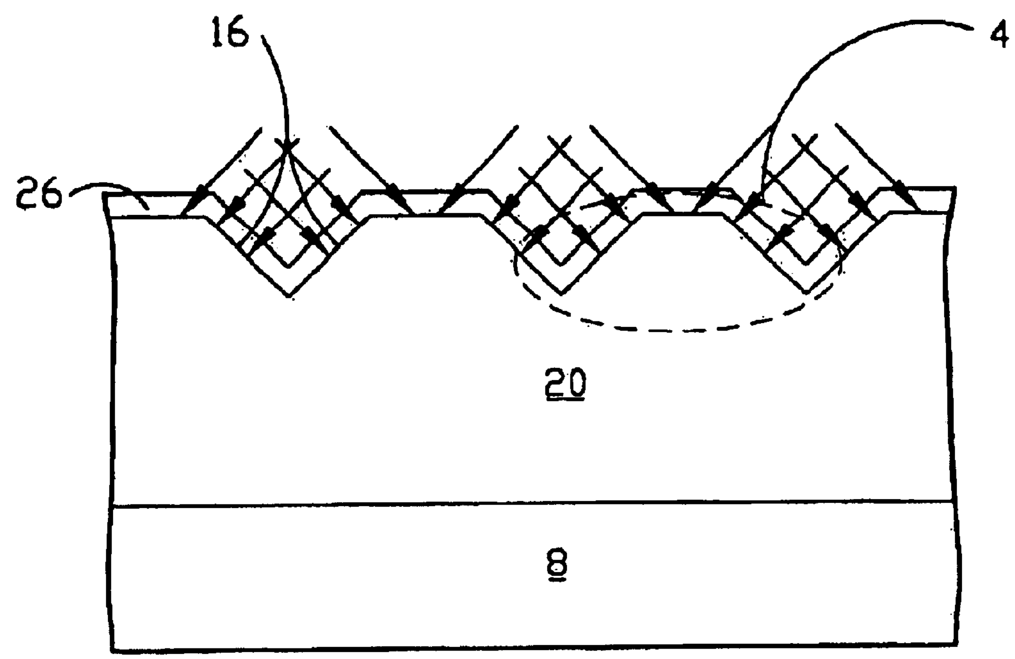

Referring now to FIGS. 2–4, the manufacturing in the present invention will be explained. A Hard Mask 22 (masking layer) that may be contributed from a pad oxide layer 221 and a SiNx layer 222 is formed on the surface of the epitaxial layer 20 in the standard manner. The pad oxide layer 221 is preferably thermally grown, and the SiNx layer 222 is preferably grown by Low Pressure Chemical Vapor Deposition (LPCVD).

A photoresist (PR) 24 has already been applied, defined, and developed by a designed pattern on the surface of the Hard Mask 22 in the standard manner. The photoresist 24 protects the hard mask 22 in the areas that the trapezoid pillars 4 are formed on. Etch away the hard mask 22 where is not protected by the photoresist mask 24, and preferably etch by Reactive Ion Etching (R.I.E.). Then strips the photoresist 24. The structure shown in FIG. 2 becomes the structure shown in FIG. 3 through the above processing.

Etch the epitaxial layer 20 to form the edges 16 by an isotropic plasma etching or a (110) crystallographic plane selective wet etching. As shown in FIG. 3, the edges 16 being formed under the hard mask 22 paralleling to the (110) or the (111) crystallographic plane, as shown in FIG. 1 nd FIG. 3. After forming the edges 16, strip the Hard ask 22 to become the structure shown in FIG. 4.

Grow a sacrificial oxide layer 26 on the surface of the trapezoid pillars 4. After growing the sacrificial oxide layer 26 over the surface of the trapezoid pillars 4, anisotropically implant ions into the trapezoid pillars 4 through the sacrificial oxide layer 26 to form an implanting region along the surface of the trapezoid pillars, and then remove the sacrificial oxide layer 26. The ions for being implanting into the trapezoid pillars preferably are phosphorous ions for PMOS and boron ions for NMOS. The tilted angle for anisotropically implanting is preferably 45° and the directions for implanting is preferably 45°, 135°, 225°, or 315°.

Anisotropical implantation that implants ions into the trapezoid pillars to form the implanting region at the angles being mentioned above is better than isotropical implantation. Isotropical implantation causes several disadvantages, for example, high sensitivity of energy dependence, lower implant dosage efficiency and uneven dopant profile in the active layer of the field effect transistor in the present invention, because the isotropical implantation implant ions unaveragely into the surface of the trapezoid pillars. Anisotropical implantation arrives at advantages as higher dopant concentration, less energy dependent profiles and better channel dopant uniformity in the present invention, because anisotropical implantation with the angles implants ions very averagely into the surface of the trapezoid pillars.

Figure 5:
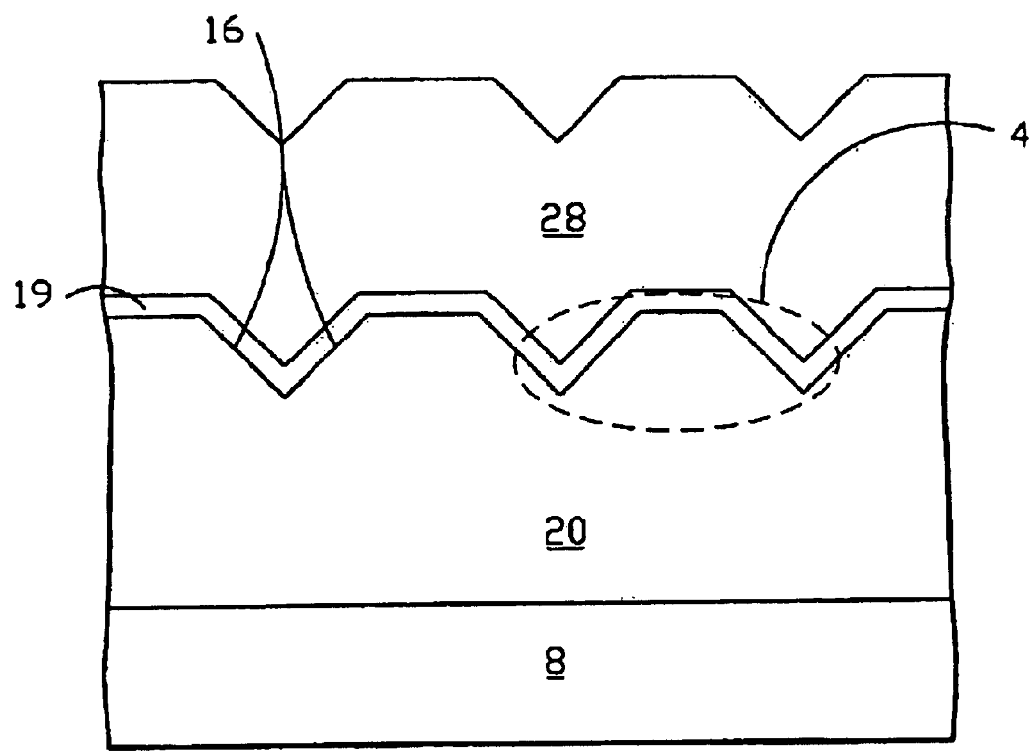

After removing the sacrificial oxide 26, grow a dielectric oxide layer 19 on the surface of the trapezoid pillars 4, as shown in FIG. 5, and deposit a gate layer 28 on the dielectric oxide layer 19. Then deposit, define, and develop a photo resist layer (second resist layer, not shown) on the surface of the gate layer 28 to define, develop and etch the gate layer 28 and the dielectric oxide layer 19 to form the gate 14 in the standard manner, as shown in FIG. 1.

Implant dopant to form the drain 12 and the source 10 within the two ends of the trapezoid pillars as shown in FIG. 1. Naturally, contact openings will be formed to contact with the source 10, the drain 12 and the gate 14. A metallization layer will then be applied and defined, and a protective oxide layer will be formed thereover. Finally, bond pad openings will be formed in the protective oxide layer in the standard manner.

The present invention relies upon the silicon layer is a (100) crystallographic plane. Thus the edges 16 are formed from etching the silicon layer 20 to form the trapezoid pillars 4.

The structure of the field effect transistor with trapezoid-triple-gate is described. The triple gate field effect transistor includes plural trapezoid pillars being transversely formed on a substrate. Every trapezoid pillar parallels to each other and includes a source, a drain and a gate part. In the same trapezoid pillar, the gate part is formed between the source and the drain. A dioxide layer is formed on the gate parts and under a gate that is formed on the dioxide layer.

Because the tripe gate is formed on trapezoid pillars, the field effect transistor in the present invention prevents the falling down or stripping-off like that in the prior art, and greatly increases channel width of the field effect transistor. Furthermore, the triple gate that is formed on trapezoid pillars increases the ultra-high device density that may be smaller than 30 nm because of the increasing device channel conductance. Namely, the field effect transistors in the present invention assures the process and the device reliabilities, and decrease the production cost of the field effect transistor.

Although specific embodiments have been illustrated and described, it will be obvious to those who skilled in the art that various modifications may be made without departing from what intended to limit solely by the appended claims.

What is claimed is:

1. A triple gate field effect transistor, comprising:

a substrate; and a plurality of trapezoid pillars, each said trapezoid pillar having a top surface and two inclined sidewalls, said top surface being approximately parallel to said substrate;

wherein said trapezoid pillar includes a channel region being formed on said top surface and formed on the entire said inclined sidewalls, a source region being adjacent to the channel region and formed on one of two ends of said trapezoid pillar, and a drain region formed on said other end of said trapezoid pillar and separated away from the source region by the channel region.

2. The triple gate field effect transistor of claim 1, wherein said trapezoid pillars include epitaxially grown crystal.

3. The triple gate field effect transistor of claim 2, wherein said epitaxially grown crystal has a (100) crystallographic plane.

4. The triple gate field effect transistor of claim 3, wherein said top surface is approximately parallel to the (100) crystallographic plane, and one of said inclined sidewall is approximately parallel to a (110) crystallographic plane.

5. The triple gate field effect transistor of claim 3, wherein said top surface is approximately parallel to the (100) crystallographic plane, and one of said inclined sidewall is approximately parallel to a (111) crystallographic plane.

6. The triple gate field effect transistor of claim 1, wherein said trapezoid pillars are shaped by isotropic plasma etching.

7. The triple gate field effect transistor of claim 6, wherein said isotropic plasma etching is selective wet etching with a (110) crystallographic plane.

8. The triple gate field effect transistor of claim 1, further comprising an implanted region along the top surface of the inclined sidewalls of said trapezoid pillars.

9. A triple gate field effect transistor, comprising:

a substrate;

a plurality of trapezoid pillars, each said trapezoid pillar having a top surface and two inclined sidewalls, said top surface being approximately parallel to said substrate; and an implanted region alone the top surface and along the entire inclined sidewalls of said trapezoid pillars, wherein said implanted region is formed by angle implantation, a direction of said angle implantation is at an angle of about 45, 135, 225 or 315 degrees with respect to the substrate.

10. The triple gate field effect transistor of claim 1, further comprising a gate region a top of the channel region.

11. The triple gate field effect transistor of claim 10, further comprising a dielectric layer formed between the channel region and the gate region.

12. A triple gate field effect transistor, comprising a substrate;

a plurality of trapezoid pillars juxtaposed with ends connected, each said trapezoid pillar having a source, a channel region including a top surface and the entire two side surfaces, and a drain aligned in longitudinal direction and a gate latitudinally superposed said channel region of said trapezoid pillars;

wherein said source is formed on one of two ends of said trapezoid pillar, and said drain is formed on said other end of said trapezoid pillar.

13. The triple gate field effect transistor of claim 12, further comprising a dielectric layer formed between said channel region and the said gate.

* * * * *